(12) United States Patent
Choi

(10) Patent No.: US 7,439,095 B2
(45) Date of Patent: Oct. 21, 2008

(54) CMOS IMAGE SENSOR AND METHOD FOR FABRICATING THE SAME

(75) Inventor: Jong Woon Choi, Seongnam (KR)

(73) Assignee: Dongbu Electronics, Co., Ltd., Seoul (KR)

(*) Notice: Subject to any disclaimer, the term of this patent is extended or adjusted under 35 U.S.C. 154(b) by 223 days.

(21) Appl. No.: 11/320,702

(22) Filed: Dec. 30, 2005

(65) Prior Publication Data

US 2007/0029579 A1 Feb. 8, 2007

(30) Foreign Application Priority Data

Aug. 3, 2005 (KR) ...................... 10-2005-0071015

(51) Int. Cl.
*H01L 21/00* (2006.01)
(52) U.S. Cl. ................................. 438/70; 257/E21.596
(58) Field of Classification Search .................... 438/57, 438/65, 69
See application file for complete search history.

(56) References Cited

U.S. PATENT DOCUMENTS 6,507,059 B2 * 1/2003 Chen et al. .................. 257/290

FOREIGN PATENT DOCUMENTS

KR 10-2001-0061308 7/2001
KR 10-2001-0098505 11/2001

* cited by examiner

*Primary Examiner*—Richard A. Booth
(74) *Attorney, Agent, or Firm*—McKenna Long & Aldridge LLP

(57) ABSTRACT

A CMOS image sensor includes a substrate including a sensing part and a peripheral driving part; a first insulating interlayer formed over an entire surface of the substrate; a first metal line formed on the first insulating interlayer in each of the sensing and peripheral driving parts; a second insulating interlayer formed over the entire surface of the substrate including the first metal line; a second metal line formed on the second insulating interlayer in each of the sensor and peripheral drive parts; an etch-stop layer formed over the entire surface of the substrate including the second metal line; a third insulating interlayer formed on the peripheral driving part of the etch-stop layer; a third metal line formed on the third insulating interlayer; a fourth insulating interlayer formed on the third insulating interlayer including the third metal line, to be disposed in the peripheral driving part; and a fourth metal line formed on the fourth insulating interlayer.

8 Claims, 7 Drawing Sheets

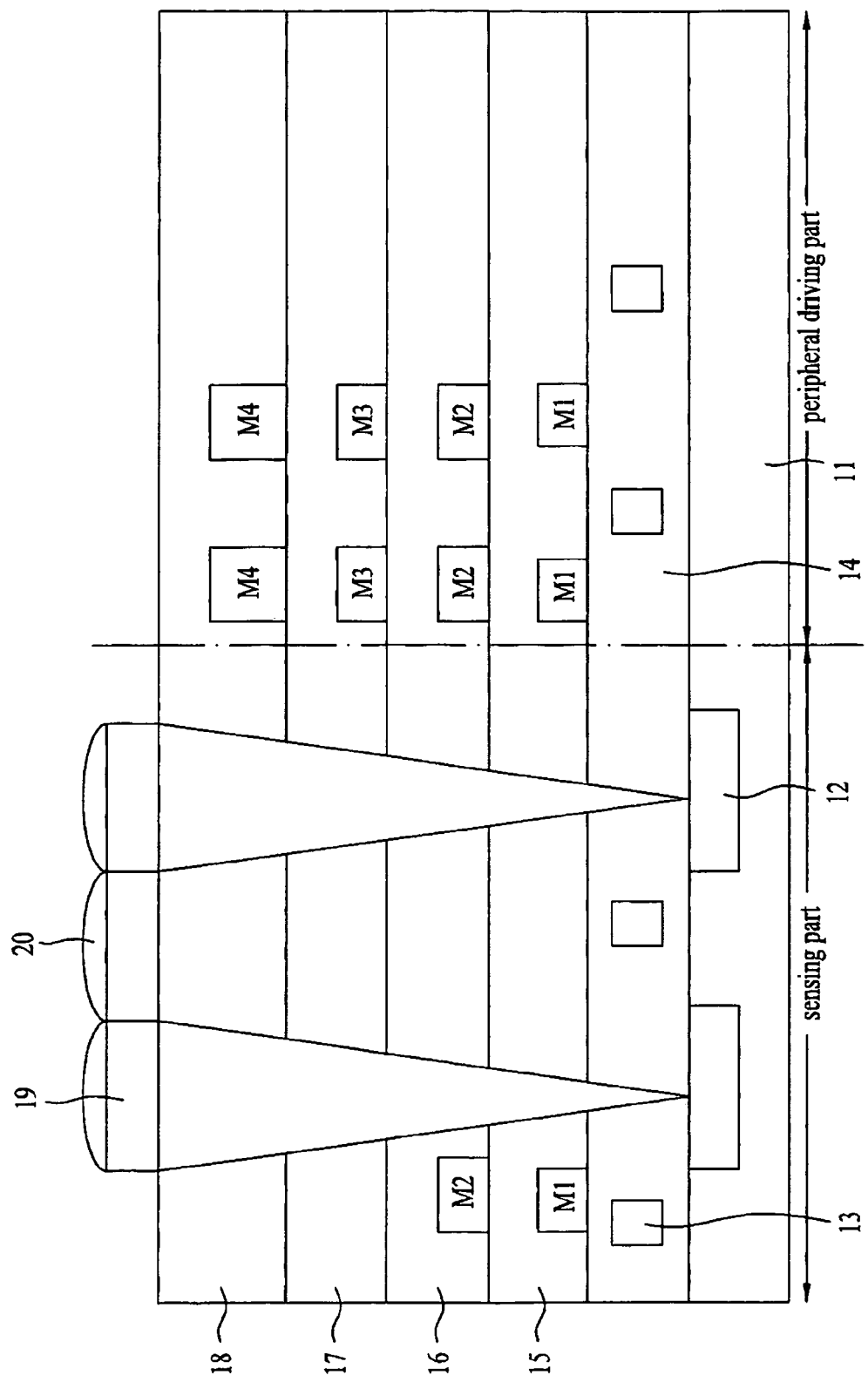

CMOS IMAGE SENSOR AND METHOD FOR FABRICATING THE SAME

CROSS-REFERENCE TO RELATED APPLICATION

This application claims the benefit of Korean Patent Application No. 10-2005-0071015, filed on Aug. 3, 2005, which is hereby incorporated by reference as if fully set forth herein.

BACKGROUND OF THE INVENTION

1. Field of the Invention

The present invention relates to an image sensor, and more particularly, to a CMOS image sensor and method for fabricating the same. Although the present invention is suitable for a wide scope of applications, it is particularly suitable for enhancing light-condensing and photosensitivity characteristics.

2. Discussion of the Related Art

An image sensor is a semiconductor device that converts an optic image to an electric signal. In a charge-coupled device (CCD) image sensor, a plurality of metal-oxide-semiconductor (MOS) capacitors are arranged close to one another to transfer and store electrical charge carriers. In a complementary MOS (CMOS) image sensor, a plurality of MOS transistors, corresponding to the number of pixels, are fabricated by CMOS technology using a control circuit and a signal processing circuit as peripheral circuits and a switching system of sequential detecting outputs using the MOS transistors.

The CCD has a complicated drive system, high power consumption, a complicated fabricating process including too many steps, and difficulty in being implemented into one-chip due to the difficulty in implementing a signal processing circuit within a CCD chip. To overcome these disadvantages, sub-micron CMOS fabrication has been developed. That is, a CMOS image sensor enables the one-chip implementation with several signal processing circuits. The CMOS image sensor reproduces an image using a photodiode and MOS transistors within a unit pixel and detects signals sequentially by a switching system. Thus, the CMOS image sensor adopts CMOS fabrication technology and its fabrication process, which requires about twenty masks and is simpler than the CCD process that needs at least thirty to forty masks.

Referring to FIG. 1, a unit pixel of a conventional CMOS image sensor includes a photodiode PD for receiving light to generate photocharges, a transfer transistor Tx for transferring the photocharges generated from the photodiode PD to a floating diffusion (FD) region, a reset transistor Rx for setting a potential of the floating diffusion region to a specific value and resetting the floating diffusion region by discharging electric charges, a drive transistor Dx acting as a source-follower buffer amplifier, and a select transistor Sx acting a switching device to enable addressing. A load transistor is provided outside the unit pixel to read an output signal.

FIG. 2 illustrates a unit pixel of a conventional CMOS image sensor, in which elements associated with light-condensing and focusing are shown.

Referring to FIG. 2, a field oxide layer (not shown) is formed on a semiconductor substrate 11 divided into a sensor part and a peripheral drive part to define an active area. A plurality of photodiodes 12 and transistors 13 are formed over the semiconductor substrate 11. A first insulating interlayer 14 is formed over the semiconductor substrate 11, including the photodiodes 12 and transistors 13. A plurality of metal lines M1-M4 are formed over the first insulating interlayer 14 to configure a unit pixel. The metal lines M1-M4 are arranged to pass incident light, which strikes the corresponding photodiode 12. Second, third, and fourth insulating interlayers 15, 16, and 17 and a planarizing layer 18 are formed between the metal lines M1-M4 for electrical insulation. An RGB color filter layer 19 for color image implementation is formed on the planarizing layer 18 in the sensor part. A plurality of domed microlenses 20 of photoresist are formed on the color filter layer 19 to concentrate incident light on the photodiode 12. Each microlens 20 is formed by coating the photoresist, patterning the photoresist to cover the corresponding photodiode 12, and carrying out a reflow process on the patterned photoresist to obtain a specific curvature.

When a device is highly integrated, however, the metal lines are provided to different layers, which increases the total thickness of the insulating interlayers and the distance between the microlenses 20 and photodiodes 12. Therefore, it is difficult for the microlenses 20 to properly focus the light onto the corresponding photodiode. In particular, although there are only two tiers to the metal lines M1 and M2 in the sensing part, the second, third, and fourth insulating interlayers 15, 16, and 17 are stacked. Hence, the thick layers that substantially exist between the microlens 20 and the photodiode 12 weakens incident light to degrade image quality. In addition, deviating from an incident angle due to the distance between the microlens 20 and the photodiode 12, incoming light enters a neighboring pixel to bring about color interference of crosstalk. Hence, the image quality is degraded as well.

To overcome the above problems, the thickness of each of the insulating interlayers over the photodiode 12 can be reduced. By doing this, the intensity of the light received by the photodiode 12 is increased to enhance the image quality. In doing so, however, the generation of excessive parasitic capacitance between the metal lines is likely to cause problems such as leakage current, particularly in the peripheral driving part.

SUMMARY OF THE INVENTION

Accordingly, the present invention is directed to a CMOS image sensor and method for fabricating the same that substantially obviates one or more problems due to limitations and disadvantages of the related art.

The present invention provides a CMOS image sensor and method for fabricating the same, which increases the intensity of light incident on a photodiode via a microlens and which prevents leakage current in a peripheral driving part.

Additional advantages and features of the invention will be set forth in the description which follows and will become apparent to those having ordinary skill in the art upon examination of the following. These and other advantages of the invention may be realized and attained by the structure particularly pointed out in the written description and claims hereof as well as the appended drawings.

To achieve these and other advantages in accordance with the invention, as embodied and broadly described herein, there is provided a CMOS image sensor comprising a substrate including a sensing part and a peripheral driving part; a first insulating interlayer formed over an entire surface of the substrate; a first metal line formed on the first insulating interlayer in each of the sensing and peripheral driving parts; a second insulating interlayer formed over the entire surface of the substrate, including the first metal line; a second metal line formed on the second insulating interlayer in each of the sensor and peripheral drive parts; an etch-stop layer formed over the entire surface of the substrate, including the second metal line; a third insulating interlayer formed on the peripheral driving part of the etch-stop layer; a third metal line formed on the third insulating interlayer; a fourth insulating interlayer formed on the third insulating interlayer, including the third metal line, to be disposed in the peripheral driving part; and a fourth metal line formed on the fourth insulating interlayer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention, illustrate exemplary embodiments of the invention and together with the description serve to explain the principle of the invention. In the drawings:

FIG. 2 is a cross-sectional diagram of a conventional CMOS image sensor; and

DETAILED DESCRIPTION OF THE INVENTION

Reference will now be made in detail to exemplary embodiments of the present invention, examples of which are illustrated in the accompanying drawings. Wherever possible, like reference designations will be used throughout the drawings to refer to the same or similar parts.

The sensing part of a CMOS image sensor according to the present invention includes two insulating interlayers, while the peripheral driving part includes four insulating interlayers to enable a shorter distance from a microlens to a corresponding photodiode 101.

FIGS. 3A-3E respectively illustrate sequential process steps of an exemplary method of fabricating a CMOS image sensor according to the present invention.

Figure 1:
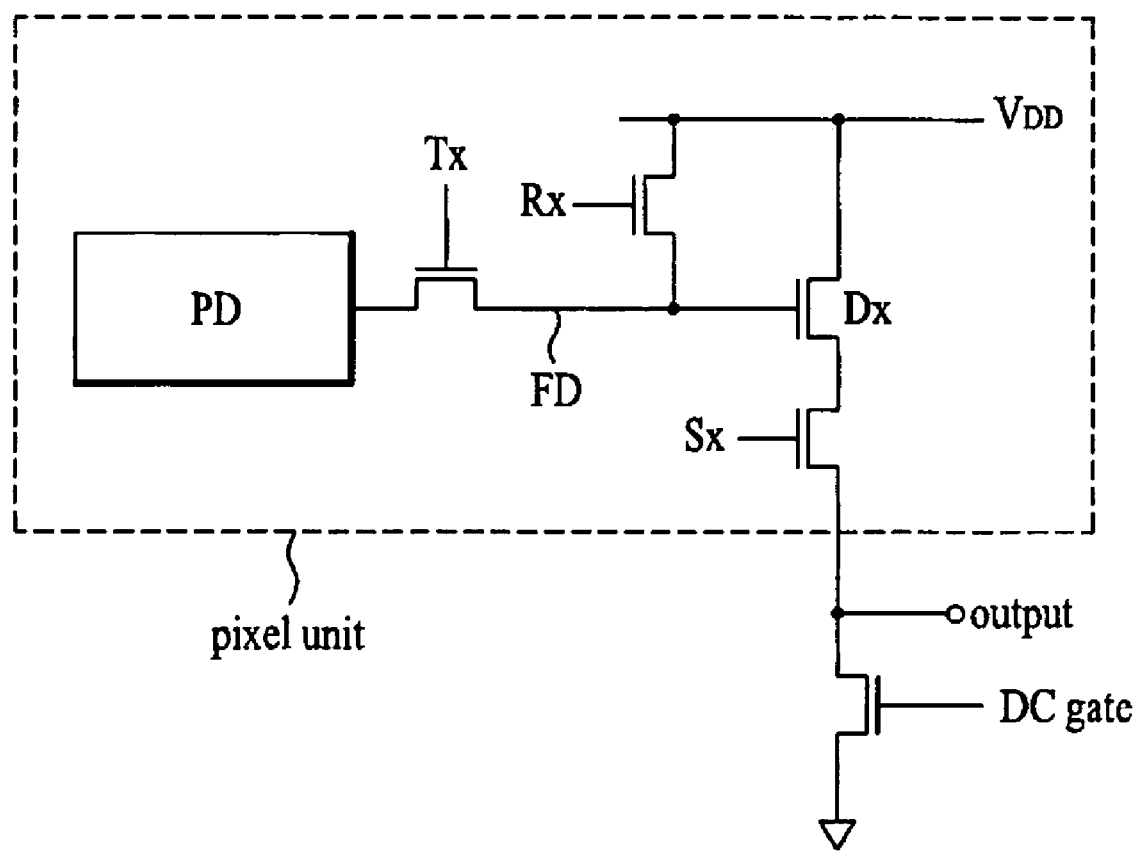
FIG. 1 is a circuit diagram of a unit pixel, including one photodiode and four MOS transistors, in a general CMOS image sensor.
Figure 3A:
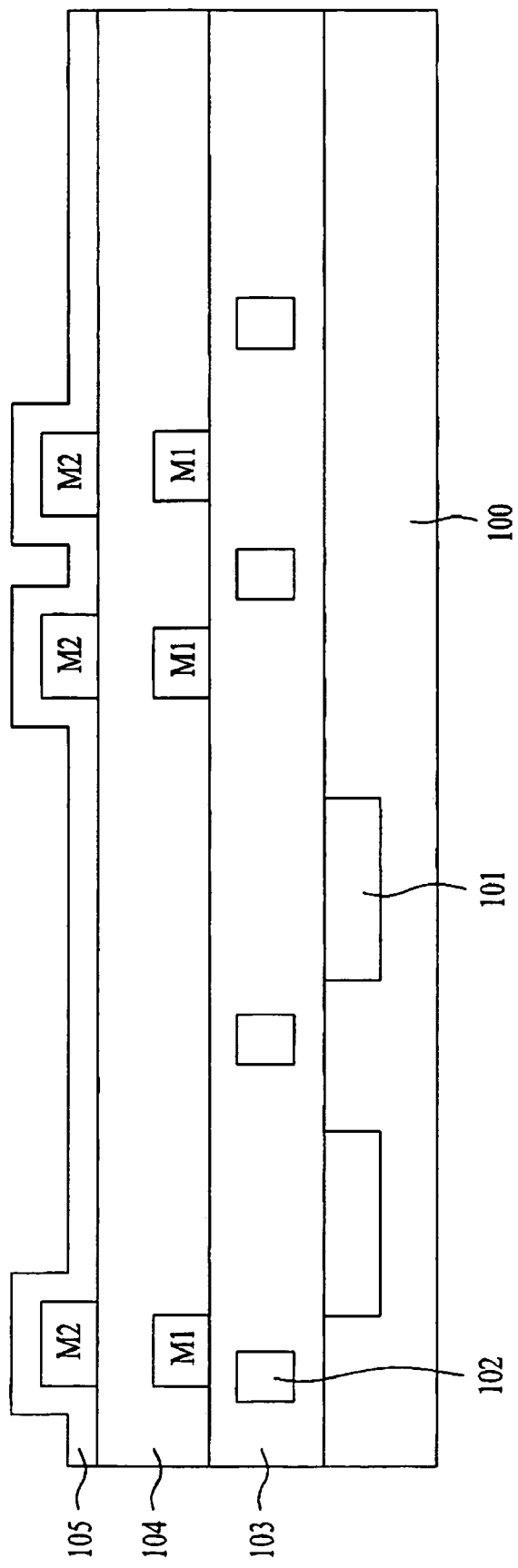
FIGS. 3A-3E are cross-sectional diagrams of an exemplary CMOS image sensor manufactured according to sequential process steps of an exemplary method according to the present invention.

Referring to FIG. 3A, a field oxide layer (not shown) defines an active area of a semiconductor substrate 100, which is thus divided into a sensing part and a peripheral driving part. A plurality of photodiodes 101 and transistors 102 are formed in the active area of the semiconductor substrate 100. A first insulating interlayer 103 is formed over the semiconductor substrate 100, including the photodiodes 101 and the transistors 102. A first metal layer is deposited on the first insulating interlayer 103. The first metal layer is then selectively patterned to form a first metal line M1 in each of the sensing and peripheral driving parts. A second insulating interlayer 104 is formed over the semiconductor substrate 100, including the first metal line M1. A second metal layer is deposited on the second insulating interlayer 104. The second metal layer is then selectively patterned to form a second metal line M2 in each of the sensing and peripheral driving parts. An etch-preventing nitride layer 105 is formed over the semiconductor substrate 100, including the second metal line M2.

It should appreciated that the first and second insulating interlayers 103 and 104 will remain in each of the sensing and peripheral driving parts. The distance between the microlens 111 and the photodiode 101 will be determined by the total thickness of these two layers.

Figure 3B:
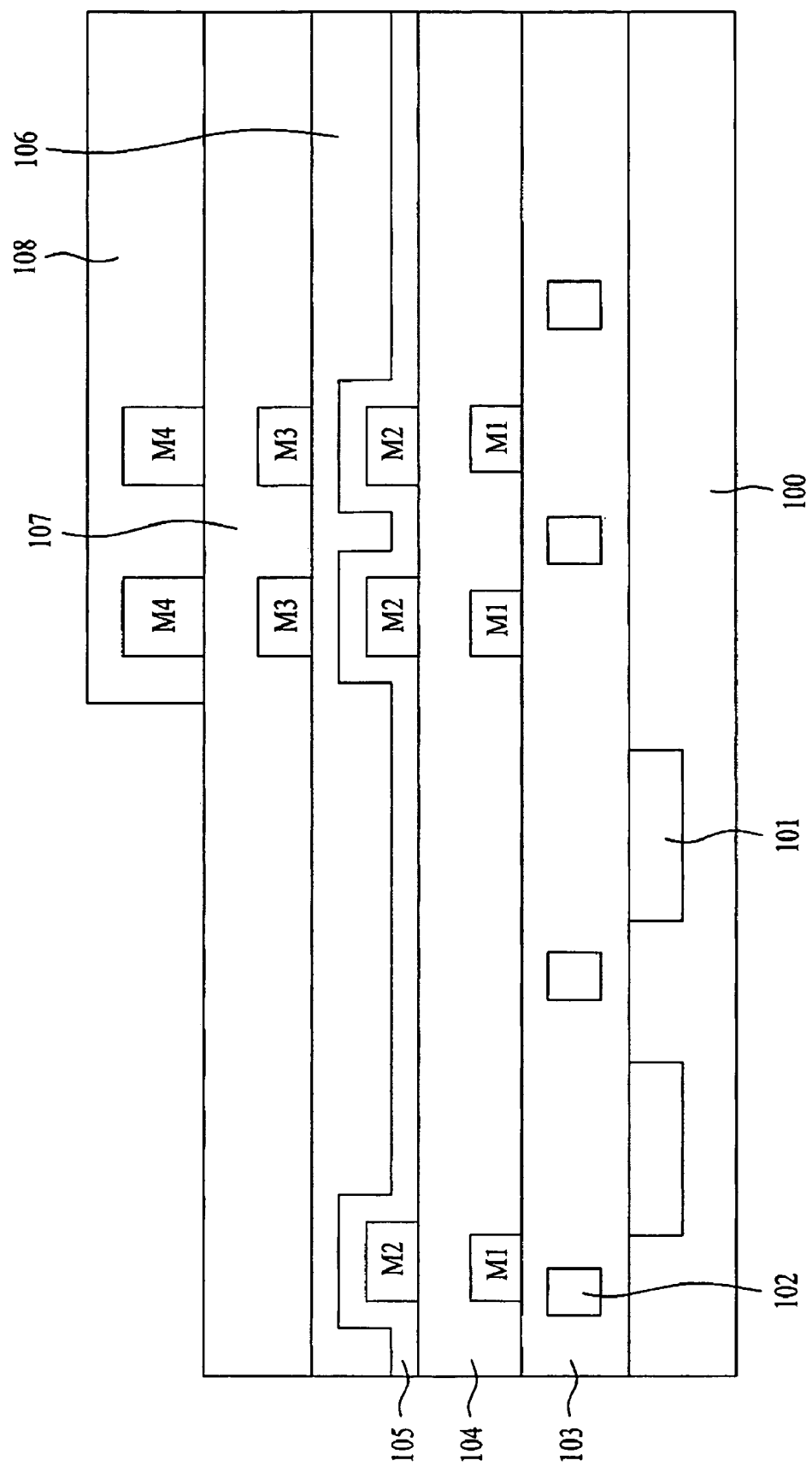

Referring to FIG. 3B, a third insulating interlayer 106 is formed on the nitride layer 105 to exist temporarily in both parts, and a third metal layer is deposited on the third insulating interlayer. The third metal layer is then selectively patterned to form a third metal line M3 in the peripheral driving part. A fourth insulating interlayer 107 is formed over the semiconductor substrate 100, including the third metal line M3, to exist temporarily in both parts, and a fourth metal layer is deposited on the fourth insulating interlayer. The fourth metal layer is then selectively patterned to form a fourth metal line M4 in the peripheral driving part. The semiconductor substrate 100, including the fourth metal line M4, is coated with photoresist, which undergoes exposure and development steps to form a photoresist pattern 108 remaining in the peripheral driving part only.

Figure 3C:
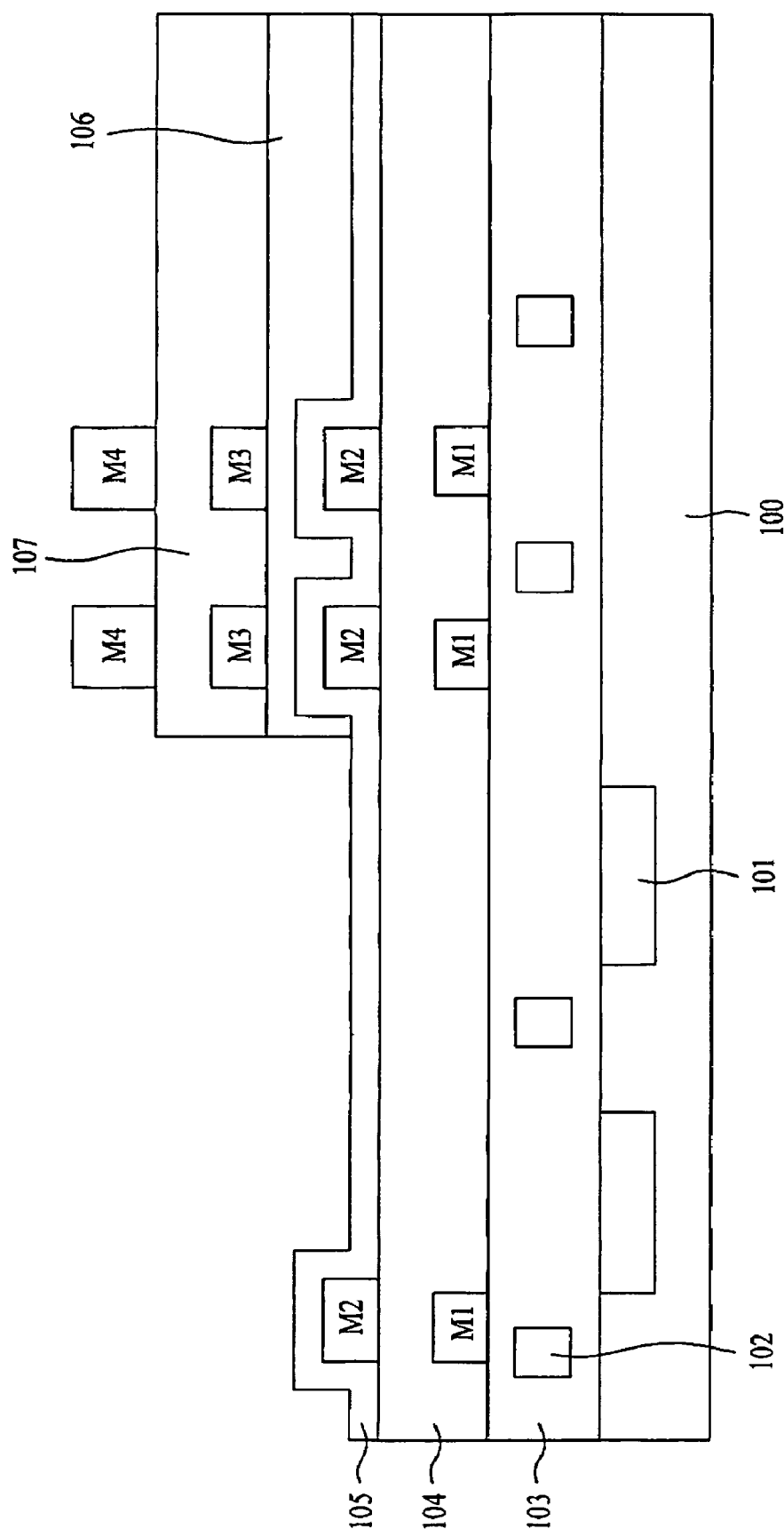

Referring to FIG. 3C, the fourth and third insulating interlayers 107 and 106 are selectively removed from the sensor part of the semiconductor substrate 100 using the photoresist pattern 108 as a mask and using the nitride layer 105 formed on the second insulating interlayer 104 as an etch stop layer. The fourth and third insulating interlayers 107 and 106 are removed by wet etching, dry etching, or a combination of each, after which the photoresist pattern 108 is removed.

Therefore, the third and fourth insulating interlayers 106 and 107 remain in the peripheral driving part, while the first and second insulating interlayers 103 and 104 exist in both the sensing part and the peripheral driving part. The shorter distance, offered by the absence in sensing part of the two additional layers, enables increased photosensitivity.

Figure 3D:
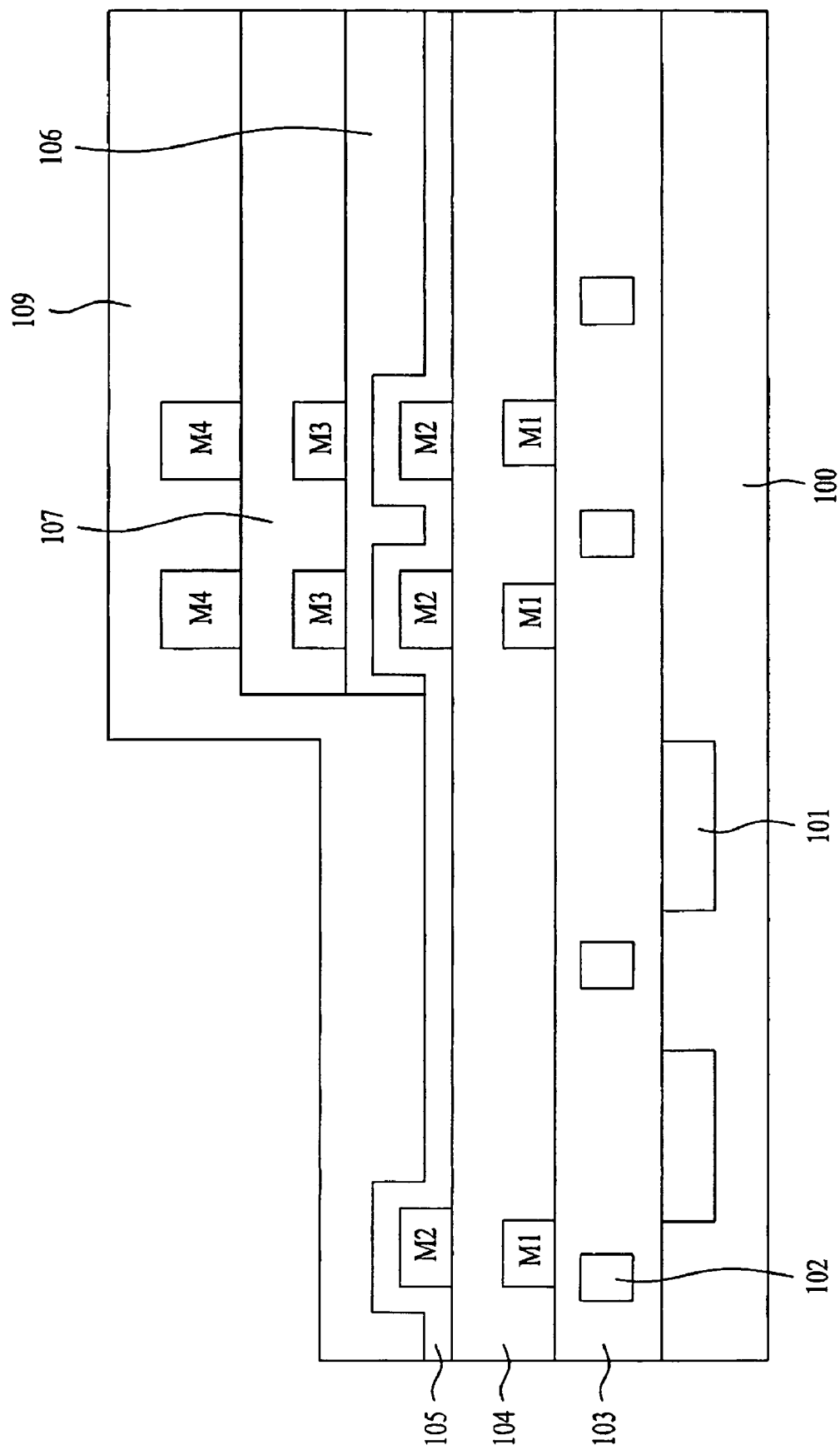

Referring to FIG. 3D, a planarization layer 109 is formed by depositing a nitride layer or the like over the semiconductor substrate 100.

Figure 3E:
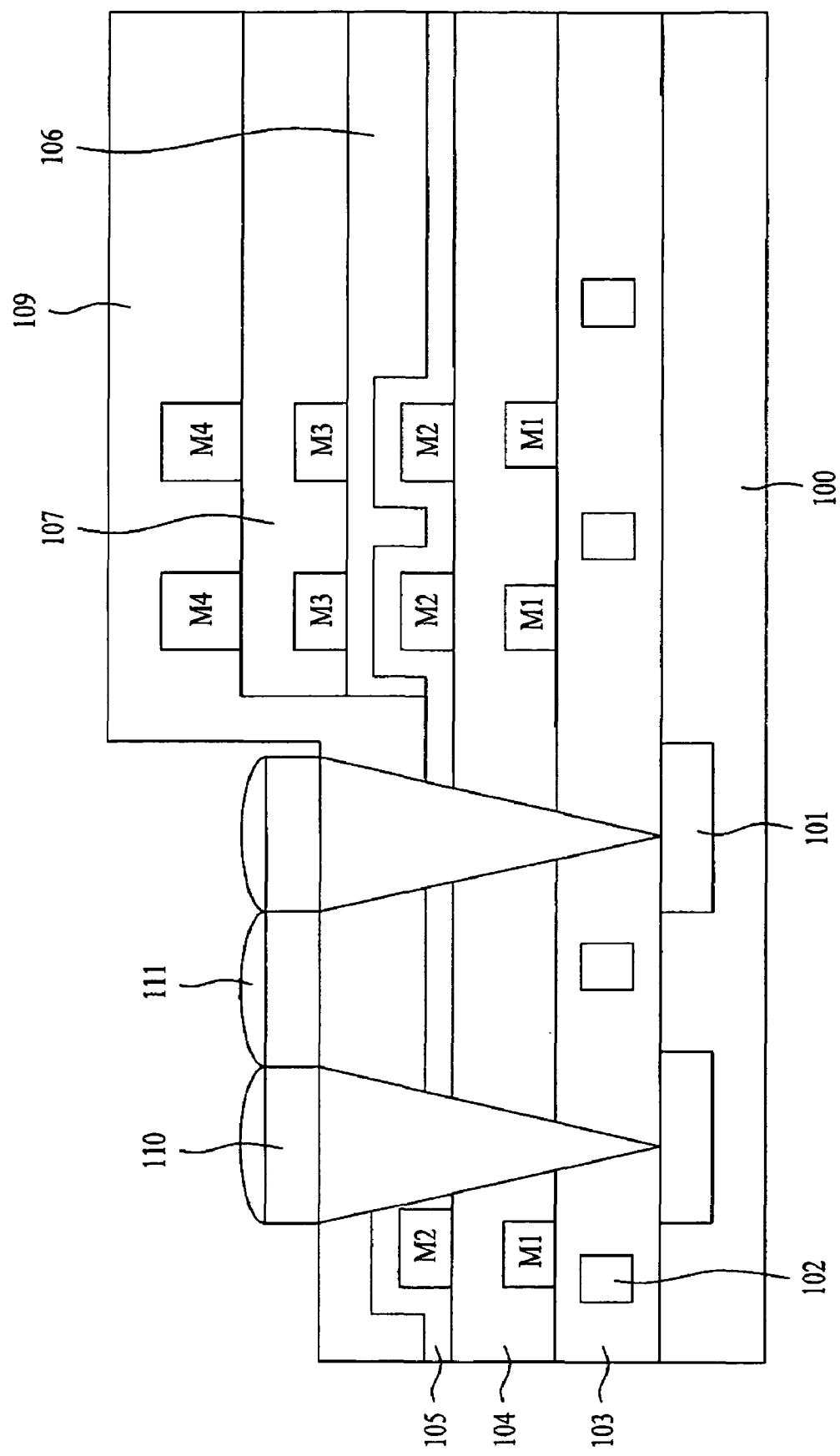

Referring to FIG. 3E, the planarization layer 109 is coated with a colored resist, which undergoes exposure and development steps to form, in the sensing part, a color filter layer 110 for filtering light per wavelength. The semiconductor substrate 100, including the color filter layer 110, is coated with a microlens-forming substance layer of resist or an oxide layer such as TEOS, which also undergoes exposure and development steps, to form a microlens pattern on the color filter layer 110. Optionally, before applying the microlens-forming substance layer, a planarization layer (not shown) can be formed on the color filter layer 110. Subsequently, a reflowing process is carried out on the microlens pattern to form microlenses 111 to impart a specific curvature to the upper surface of each microlens controlled according to a heating and contracting of the reflowing process. The reflowing can be carried out using a hot plate or furnace. The microlens patterns 111 is then hardened by the application of ultraviolet light to maintain an optimal curvature radius, which determines the focusing effect.

Accordingly, a CMOS image sensor according to the present invention is shown in FIG. 3E. The CMOS image sensor includes the plurality of photodiodes 101 and various transistors 102 formed on the semiconductor substrate 100 divided into a sensing part and a peripheral driving part; the first insulating interlayer 103 formed over the semiconductor substrate, including the photodiodes and transistors; the first metal line M1 formed on the first insulating interlayer in each of the sensing and peripheral driving parts; the second insulating interlayer 104 formed over the semiconductor substrate, including the first metal line; the second metal line M2 formed on the second insulating interlayer in each of the sensing and peripheral driving parts; the nitride layer 105 formed over the semiconductor substrate, including the second metal line; the third insulating interlayer 106 formed on the nitride layer in the peripheral driving part; the third metal line M3 formed on the third insulating interlayer; the fourth insulating interlayer 107 formed over the semiconductor substrate, including the third metal line in the peripheral driving part; the fourth metal line M4 formed on the fourth insulating interlayer; the planarization layer 109 formed over the semiconductor substrate, including the fourth metal line; the color filter layer 110 formed on the planarization layer in the sensing part; and the microlens pattern 111 formed on the color filter layer. Therefore, in the CMOS image sensor according to the present invention, only the first and second insulating interlayers 103 and 104 are formed in the sensing part, while the first to fourth insulating interlayers 103, 104, 106, and 107 are formed in the peripheral drive part.

According to the present invention, photosensitivity can be enhanced by reducing the thickness of the insulating layer between the microlens and the photodiode in the sensing part, thereby reducing the loss of light, and as the distance between the microlens and the photodiode is decreased, crosstalk due to large angles of incidence can be reduced. The improved photosensitivity and crosstalk characteristics enhance image quality under bright light and low light conditions. Moreover, since there is no longer an arbitrary limitation on the number of metal layers in the peripheral drive part, the use of more metal line layers can lead to design improvements.

It will be apparent to those skilled in the art that various modifications can be made in the present invention without departing from the spirit or scope of the invention. Thus, it is intended that the present invention covers such modifications provided they come within the scope of the appended claims and their equivalents.

What is claimed is:

1. A method of fabricating a CMOS image sensor, comprising:
    defining a sensing part and a peripheral driving part of a substrate;
    forming a first insulating interlayer over a surface of the substrate;
    forming a first metal line on the first insulating interlayer in each of the sensing and peripheral driving parts;
    forming a second insulating interlayer over the surface of the substrate, including the first metal line;
    forming a second metal line on the second insulating interlayer in each of the sensing and peripheral driving parts;
    forming an etch-stop layer over the surface of the substrate, including the second metal line;
    forming a third insulating interlayer over the surface of the substrate, including the etch-stop layer;
    forming a third metal line on the third insulating interlayer in the peripheral driving part;
    forming a fourth insulating interlayer on the third insulating interlayer, including the third metal line
    forming a fourth metal line on the fourth insulating interlayer in the peripheral driving part; and
    removing the fourth insulating interlayer and the third insulating interlayer from the sensing part.

2. The method of claim 1, wherein removing the third and fourth insulating interlayers from the sensing part is performed by a selective etching process.

3. The method of claim 2, wherein the selective etching process is one of a wet etching process, a dry etching process, and a combination of the wet etching and dry etching processes.

4. The method of claim 1, further comprising:
    forming a photoresist pattern covering the peripheral driving part; and
    using the photoresist pattern as a mask during the selective etching process.

5. The method of claim 1, further comprising:
    forming a color filter layer in the sensing part; and
    forming a plurality of microlenses on the color filter layer.

6. The method of claim 5, further comprising:
    forming a planarization layer over surfaces of the substrate to provide a surface for receiving the color filter layer and the plurality of microlenses.

7. The method of claim 1, wherein the etch-stop layer is a nitride layer.

8. The method of claim 1, further comprising:
    forming a plurality of photodiodes in the substrate; and
    forming a plurality of transistors on the substrate,
    wherein the first insulating interlayer is formed over the plurality of transistors.

* * * * *